(12) United States Patent
Graumann et al.

(10) Patent No.: US 8,631,309 B2
(45) Date of Patent: Jan. 14, 2014

(54) FORWARD ERROR CORRECTION WITH EXTENDED EFFECTIVE BLOCK SIZE

(75) Inventors: Peter Graumann, Calgary (CA); Sean Gibb, Calgary (CA); Stephen Bates, Canmore (CA)

(73) Assignee: PMC-Sierra, Inc., Sunnyvale, CA (US)

( * ) Notice: Subject to any disclaimer, the term of this patent is extended or adjusted under 35 U.S.C. 154(b) by 113 days.

(21) Appl. No.: 13/464,033

(22) Filed: May 4, 2012

(65) Prior Publication Data
US 2012/0300873 A1    Nov. 29, 2012

Related U.S. Application Data

(60) Provisional application No. 61/482,288, filed on May 4, 2011, provisional application No. 61/508,924, filed on Jul. 18, 2011.

(51) Int. Cl.
*H03M 13/03*    (2006.01)

(52) U.S. Cl.
USPC ........... 714/786; 714/776; 714/764; 714/804; 714/780; 714/792; 714/795; 714/796; 714/800

(58) Field of Classification Search
None
See application file for complete search history.

(56) References Cited

U.S. PATENT DOCUMENTS

| | | | | |
|---|---|---|---|---|
| 7,219,295 | B2 * | 5/2007 | Yamada | 714/758 |
| 8,024,640 | B2 * | 9/2011 | Bliss et al. | 714/758 |
| 8,085,883 | B2 * | 12/2011 | Hegde et al. | 375/341 |
| 8,370,138 | B2 * | 2/2013 | Kawashima et al. | 704/229 |
| 2009/0070107 | A1 * | 3/2009 | Kawashima et al. | 704/229 |
| 2009/0089649 | A1 * | 4/2009 | Wilson et al. | 714/795 |

* cited by examiner

*Primary Examiner* — John Trimmings
(74) *Attorney, Agent, or Firm* — Occhiuti & Rohlicek LLP

(57) ABSTRACT

In an aspect, in general, a forward error correction algorithm (FEC) utilizes an FEC block structure in a manner that extends the effective error correction such that it can approach an "infinite" length to obtain benefits typical of very large FEC block size without the commensurate computation cost.

56 Claims, 12 Drawing Sheets

1
2
3  Transmit History Storage Element: $TCW[i]$, $i = n - N_{TB} + 1,\ldots,n$, each transmit block row $TCW[i]$ has
4  $N_{PS}$ bits.
5
6  Transmit codeword history element $TCW[i, j]$ has bits $(j-1)*O + 1,\ldots, j*O$ of the row,
7  $j = 1,\ldots,M$ where $M = N_{PS}/O$.
8
9  Encoder Main( )
10 {
11   n ← 0
12   forever
13   {
14     n ← n + 1
15     PR ← accept input word()
16     Encode(n)
17     Transmit $TCW[n]$
18   }
19 }
20
21 Procedure Encode(n)
22 {
23   /* form past data */
24
25   $PS \leftarrow TCW[n-S-M,M] \parallel TCW[n-S-M+1,M-1] \parallel \ldots \parallel TCW[n-S-1,1]$
26
27   /* form the combined codeword */
28
29   $CC = PS \parallel PR$
30
31   /* form encoded codeword */
32   Form LDPC binary codeword $LCW = CC \parallel PC$
33
34   /* store the transmit codeword in the history */
35   $TCW[n] \leftarrow PR \parallel PC$
36 }

FIG. 3

```
1   Receive History Storage: RCW[i], i = n - N_{RCW} + 1,...,n, each receive block row RCW[i] has N_{PS} soft bit values.
2   RCW Processing List: RPL
3
4   Decoder Main()
5   {
6       RCW, RPL ← empty
7       k ← 0
8       forever
9       {
10          RCW ← receive_block(k)    /* soft receive codeword */
11          Decode_block(k)
12          Redecode()
13          Output RCW[k - delay]
14          k ← k + 1
15      }
16  }
17
18  Procedure Decode_block(k)
19  {
20      for n = k·E,...,(k+1)·E
21      {
22          Decode_word(n)
23      }
24  }
25
26  Procedure Decode_word(n)
27  {
28      if RCW[n - S - M] out of history then return
29      PS ← RCW[n - S - M, M] || RCW[n - S - M + 1, M - 1] || ... || RCW[n - S - 1, 1]
30      CRCW ← PS || RCW[n]
31      IP = CRCW parity
32      Soft decode CRCW yielding CRCW' = PS' || RCW'
33      FP = CRCW' parity
```

FIG. 7a

```
34  if (FP/IP > 1.3 OR FP > 0.9)) then
35  {
36      RCW[n] ← RCW'
37      RCW[n − S − M, M] || RCW[n − S − M + 1, M − 1] || ... || RCW[n − S − 1, 1] ← PS'
38      Let PS = PS[M] || ... || PS[1]
39      Let PS' = PS'[M] || ... || PS'[1]
40
41      for each i = 1...H
42      {
43          if (bits flipped from PS[i] to PS'[i]) then
44          {
45              add RCW n − S − i to RPL
46          }
47      }
48  }
49  Remove RCW n from RPL
50  }
51  Procedure Redecode ()
52  {
53      f ← 0
54      n ← k · E − 1
55      while (f < F) and not out of time
56      {
57          if n is in RPL
58          {
59              Decode_word(n)
60              f ← f + 1
61          }
62          n ← n − 1
63      }
64  }
65  }
```

FIG. 7b

```
1   Decoder Main()
2   {
3       RCW, RPL ← empty
4       k ← 0
5       forever
6       {
7           for j = 1...M
8           {
9               RCW(k, j)V_C ← receive_block(k, j)
10              RCW(k, j)V_PR ← ∅
11              RCW(k, j)V_PS ← ∅
12              RCW(k, j)I_PR ← FALSE
13              RCW(k, j)I_PS ← FALSE
14          }
15          Decode_word(k)
16          Redecode()
17          Output RCW[k − delay]V_PR
18          k ← k + 1
19      }
20  }
21
22  Procedure Decode_word(n)
23  {
24      if RCW[n − S − M] out of history then return
25
26      for j = 1...M
27      {
28          if (RCW[n, j]I_PS = FALSE)
29              PR[j] ← RCW[n, j]V_C
30          else
```

FIG. 9a

```
32         PR[j] ← RCW[n, j]V_PS
33       }
34   for j = 1...M
35   {
36       if ( RCW[n−S−j, M−j]I_PR = FALSE )
37           PS[M−j] ← RCW[n−S−j, M−j]V_C
38       else
39           PS[M−j] ← RCW[n−S−j, M−j]V_PR
40   }
41   CRCW ← PS || PR
42   IP = CRCW parity
43   Soft decode CRCW yielding CRCW' = PS' || PR'
44   FP = CRCW' parity
45   Let PS = PS[M] ||...|| PS[1]
46   Let PS' = PS'[M] ||...|| PS'[1]
47   Let PR = PR[M] ||...|| PR[1]
48   Let PR' = PR'[M] ||...|| PR'[1]
49   if (FP = N_PS) /* Decode Success */
50   {
51       for j = 1...M
52       {
53           RCW[n, j]V_PR ← PR'[j]_capped
54           RCW[n, j]I_PR = TRUE
55           if (LLR sign flipped from PR[j] to PR'[j])  /* Meaning that the decoded value PR[j] is opposite in sign from V_PS */
56           {
57               add RCW n to RPL
```

FIG. 9b

```
63            }
64          }
65        }
66        for j = 1...M
67        {
68          RCW[n − S − j, M − j].V_{PS} ← PS'[j]_{capped}
69          RCW[n − S − j, M − j].I_{PS} = TRUE
70          if (LLR sign flipped from PS[j] to PS'[j]) then
71          {
72            add RCW n − S − j to RPL
73          }
74        }
75      }
76    }
77    Remove RCW n from RPL
78  }
79 )
```

FIG. 9c

FORWARD ERROR CORRECTION WITH EXTENDED EFFECTIVE BLOCK SIZE

CROSS-REFERENCE TO RELATED APPLICATIONS

Under 35 USC 119, this application claims the benefit of the priority date of U.S. Provisional Patent Application No. 61/482,288, filed on May 4, 2011, and U.S. Provisional Patent Application No. 61/508,924, filed Jul. 18, 2011, the contents of which are herein incorporated by reference.

BACKGROUND

This invention relates to forward error correction, and more particularly forward error correction systems with an extended effective block size.

Electronic communication channels can be used to transmit large quantities of information. However, such communication channels commonly include noise that can corrupt the transmitted information, thus introducing errors. To mitigate the effects of communication channel noise, error control systems are applied to the communication channels. In error controlled communication channels, the sender of the information can add carefully designed redundant information (i.e., error correction code) to its messages. The redundant information is designed such that the receiver of the messages is able to use the redundant information to detect and correct errors without the need for the sender to re-send the messages. Such schemes are generally referred to as Forward Error Correction (FEC).

Various types of coding schemes can be used to produce redundant data for an FEC scheme. One commonly used scheme is the Low Density Parity Code (LDPC). LDPC coding schemes, which encodes data such that it can be decoded efficiently using a soft decision iterative decoder, for example, based on a factor graph representation.

SUMMARY

In a general aspect, an approach to forward error correction extends the effective block size by combining past transmitted codewords with new input words, and by using a recursive decoding approach to use long-range constraints in error correction.

In an aspect, in general, an encoding method includes accepting data for transmission to a receiver, including accepting the data as a series of input words, processing the series of input words to form a series of transmit codewords, each transmit codeword being dependent on a plurality of input words, and providing the series of transmit codewords for transmission to the receiver. Processing of the series of input words includes, for each input word, accessing selected elements from a data storage for previously encoded codewords to form past data, and forming a combined codeword from the input word and the past data. The method further includes performing an encoding operation on the combined codeword forming an encoded codeword, the encoded codeword including error control information and forming a transmit codeword from the encoded codeword. The transmit codeword having less information than the encoded codeword and omitting at least some information represented in the past data, and storing at least some of the transmit codeword as elements in the data storage for previously encoded codewords.

Aspects may include one or more of the following features.

Performing the encoding operation on the combined codeword may include encoding an input word portion of the combined codeword such that a receiver of the transmit codeword can detect an inversion of the transmit codeword. The combined codeword may be encoded using a code having odd check node order for the input word portion. Accessing selected elements from the data storage for previously encoded codewords to form past data may include accessing elements from multiple previous transmit codewords in the data storage. Each element accessed to form the past data may include a multiple bit portion of a previous encoded codeword.

Each transmit codeword may include a sequence of equal size multibit portions at corresponding offsets within the transmit codeword, and the elements accessed to form the past data may include a portion of each of multiple previous transmit codewords each at a different offset with the transmit codeword. Forming the combined codeword may include concatenating the input word and the past data. Performing the encoding operation may include concatenating error control data representing the error control information determined from the input word and the past data to the combined codeword. Performing the encoding operation may include determining parity data from the combined codeword to represent the error control information.

Performing the encoding operation may include performing a block encoding operation. Forming the transmit codeword from the encoded codeword may include omitting a part of the encoded codeword representing the past data. Omitting the part of the encoded codewords may include omitting bits representing the past data.

Forming the combined codeword may include concatenating the input word and the past data, performing the encoding operation may include concatenating error control data representing the error control information to the combined codeword, and forming the transmit codeword from the encoded codeword may include forming the transmit codeword as a concatenation of the input word and the error control data omitting the past data. The input words may include binary data. The transmit codewords may include binary data. A size of the past data may be equal to a size of the transmit codeword. The selected elements from the data storage may include data elements from a plurality of previous transmit codewords.

In another aspect, in general, software stored on a tangible machine-readable medium includes instructions for causing a data processing system to perform the aforementioned steps.

In another aspect, in general, software stored on a tangible machine-readable medium including data for imparting functionality to a computer circuit design system to form a circuit description for a circuit for performing all the steps of any of the aforementioned steps.

Aspects may include one or more of the following features.

The software may include a hardware description language specification of the circuit.

In another aspect, in general, an encoder is configured to perform all the aforementioned steps.

In another aspect, in general, an encoder for accepting a series of input words and providing a corresponding series of transmit codewords for transmission to a receiver includes a data storage for previously encoded codewords and an encoding module configured process successive input words. The encoding module processes successive input words by accessing selected elements from a data storage for previously encoded codewords to form past data, forming a combined codeword from the input word and the past data, performing an encoding operation on the combined codeword forming an encoded codeword, the encoded codeword including error control information, forming a transmit codeword form the encoded codeword, the transmit codeword having less information than the encoded codeword and omitting at least some information represented in the past data, and storing at least some of the transmit codeword as elements in the data storage for previously encoded codeword.

In another aspect, in general, a decoding method includes accepting receive data, including accepting a series of receive codewords each representing corresponding transmit codeword and processing the series of receive codewords to form a series of output words, each output word being dependent on a plurality of receive codewords. The decoding method further includes providing output data, including providing the series of output words. The processing of the series of receive codewords includes, for each receive codeword applying a first decoding process to the receive codeword. The first decoding process includes accessing selected elements from a data storage for decoded codewords to form past data, forming a first combined codeword from the receive codeword and the past data, performing a decoding operation on the first combined codeword forming a first corrected codeword, the decoding operation using error control information in the first combined codeword, and for at least some receive codewords, storing at least some of the first corrected codeword as elements in the data storage for decoded codewords. Providing the output data includes retrieving data from the storage for corrected codewords.

Aspects may include one or more of the following features.

The method may further include, for each element of a plurality of elements included in each of the plurality of receive codewords, maintaining data characterizing results of previous decode operations which were performed on the element. Forming the first combined codeword from the receive codeword and the past data may include, for each element of the plurality of elements in the receive codeword and for each element of the plurality of elements in the past data, determining a value to include in the combined codeword according to the data characterizing previous decode operations. It may be determined if a corrected codeword produced by a previous decode operation is in conflict with the first corrected codeword and if so, at least some of the data characterizing results of previous decode operations included in the elements of the previously decoded codeword may be invalidated.

The data characterizing previous decode operations may include a first version of the element which was received with the receive data, a second version of the element which was successfully decoded in the receive codeword portion of the combined codeword, a third version of the element which was successfully decoded in the past data portion of the combined codeword, a first validity indicator which indicates the validity of the second version of the element, and a second validity indicator which indicates the validity of the third version of the element.

Determining the value to include in the combined codeword may include ensuring that a value of an element obtained by decoding the element in the receive codeword portion of the combined codeword is not included in subsequent receive codeword portions of the combined codeword, and ensuring that a value of an element obtained by decoding the element in the past data portion of the combined codeword is not included in subsequent past data portions of the combined codeword.

Invalidating at least some of the data characterizing results of previous decode operations included in the elements of the previously decoded codeword may include setting at least one of the first and second validity indicators to FALSE for each of the elements of the previously decoded codeword.

The method may further include accessing a plurality of processed receive codewords to which the first decoding operation has been at least once applied from the data storage for decoded codewords, reprocessing the plurality of processed receive codewords, including for each processed received codeword applying a second decoding process to the processed receive codewords. Applying a second decoding process to the processed receive codewords may include accessing selected elements from the data storage for decoded codewords to form past data, forming a second combined codeword from the processed receive codeword and the past data, performing the decoding operation on the second combined codeword forming a second corrected codeword, the decoding operation using error control information in the second combined codeword, and for at least some of the processed received codewords, storing at least some of the second corrected codeword as elements in the data storage for decoded codewords.

The method may further include, for at least some of the series of receive codewords, applying the first decoding process which may include inverting a receive codeword portion of the first combined codeword according to a parity measure of the first combined codeword. The first decoding process and the second decoding process may be the same. Applying the first decoding process may include tagging corrected codewords in the data storage for decoded codewords for reprocessing.

The method may further include for each of a plurality of decode cycles, during a first phase applying the first decoding process to a block of multiple receive codewords to which the first decoding operation has not yet been applied, maintaining an indication of processed receive codewords that were updated during the first phase, and during a second phase, applying the first decoding process to the indicated processed receive codewords. Accessing selected elements from the data storage for corrected codewords to form past data may include accessing elements determined in multiple previous decoding operations from the storage. Each element accessed to form the previous codewords may include a multiple bit portion of a previous corrected codeword. Each corrected codeword may include a sequence of equal size multibit portions at corresponding offsets within the corrected codeword, and the elements accessed to form the past data may include a portion of each of multiple previous corrected codewords each at a different offset with the corrected codeword.

Forming the combined codeword may include concatenating the receive codeword and the past data. Performing the decoding operation may include using parity data in the combined codeword. Performing the decoding operation may include performing a block decoding operation. Performing the decoding operation may include performing a Low Density Parity Check (LDPC) decoding operation. Performing the decoding operation may include performing an iterative decoding operation. Performing the decoding operation may include performing a soft decision decoding operation.

Accessing selected elements from the data storage for previous codewords may include accessing soft decision decoding output to form past data. The soft decision decoding output may include data representing probability values. The receive codewords may include data representing probability values. A size of the past data may be equal to a size of the receive codeword. The selected elements from the data storage may include data elements from a plurality of previous corrected codewords. The processing of each receive codeword may further include using a characteristic of the decoding operation to determine whether to store at least some of the corrected codeword as elements in the data storage for previous codewords.

Using the characteristic of the decoding operation may include using error-related characteristic of the corrected codeword. Using the characteristic of the decoding operation may include using a characteristic based on a number of parity constraints satisfied by the corrected codeword. Using the characteristic based on a number of parity constraints satisfied by the corrected codeword may include using a characteristic further based on a number of parity constraints satisfied by the combined codeword.

In another aspect, in general, software stored on a tangible machine-readable medium includes instructions for causing a data processing system to perform any of the aforementioned steps.

In another aspect, in general, software stored on a tangible machine-readable medium includes data for imparting functionality to a computer circuit design system to form a circuit description for a circuit for performing any of the aforementioned steps.

Aspects may include one or more of the following features.

The software of claim may include a hardware description language specification of the circuit.

In another aspect, in general, a decoder can be configured to perform all of the aforementioned steps.

In another aspect, in general, a decoder for accepting a series of receive codewords from a transmitter and providing a corresponding series of output words includes a data storage for decoded codewords and a decoding module. The decoding module configured process successive receive codewords by applying a first decoding process to each receive codeword. The first decoding process includes accessing selected elements from the data storage for decoded codewords to form past data, forming a first combined codeword from the receive codeword and the past data, performing a decoding operation on the first combined codeword forming a first corrected codeword, the decoding operation using error control information in the first combined codeword, and for at least some receive codewords, storing at least some of the corrected codeword as elements in the data storage for decoded codewords. The decoder further includes an output module configured to provide the output words by retrieving data from the storage for corrected codewords.

Aspects may include one or more of the following features.

The decoder may be further configured to access a plurality of processed receive codewords to which the first decoding operation has been at least once applied from the data storage for decoded codewords, reprocess the plurality of processed receive codewords, including for each processed receive codeword applying a second decoding process to the processed receive codewords. Applying the second decoding process to the processed receive codewords may include accessing selected elements from the data storage for decoded codewords to form past data, forming a second combined codeword from the processed receive codeword and the past data, performing the decoding operation on the second combined codeword forming a second corrected codeword, the decoding operation using error control information in the second combined codeword, and for at least some of the processed received codewords, storing at least some of the second corrected codeword as elements in the data storage for decoded codewords.

In another aspect, in general, a data communication method includes accepting data for transmission to a receiver, processing the series of input words to form a series of transmit codewords, and providing the series of transmit codewords for transmission to the receiver according to all the aforementioned steps, transmitting the transmit codewords over a communication channel to the receiver, and accepting receive data, including receiving a series of receive codewords each representing corresponding transmit codeword, processing the series of receive codewords to form a series of output words, and providing output data, including providing the series of output words according to any of the aforementioned steps.

In another aspect, in general, a data communication system includes the aforementioned encoder and the aforementioned decoder, coupled to the encoder over a communication channel.

Other features and advantages of the invention are apparent from the following description, and from the claims.

DESCRIPTION OF DRAWINGS

FIG. 3 is pseudo-code describing the operation of the encoder section.

FIG. 7 is pseudo-code describing the operation of the encoder section.

FIG. 9 is pseudo-code describing extrinsic memory operation.

DESCRIPTION

1 Overview

The following description relates to a forward error correction algorithm (FEC) that utilizes an FEC block structure in a manner that extends the effective error correction such that it can approach an "infinite" length to obtain benefits typical of very large FEC block size without the commensurate computation cost. Such benefits include, for example, efficiently producing decoded data with a high coding gain, in some examples more closely approaching the information theoretic coding rate limit than other known approaches.

In the examples described below, an encoder utilizes past data, present data, and error correction data to implement a fixed size FEC block structure that, when applied in an iterative/recursive manner yields attributes of an FEC block with infinite length. To manage the complexity of implementing the algorithm, a decoder focuses on relatively small interesting portions of the FEC block structure, thus making the hardware implementation manageable.

Figure 1:
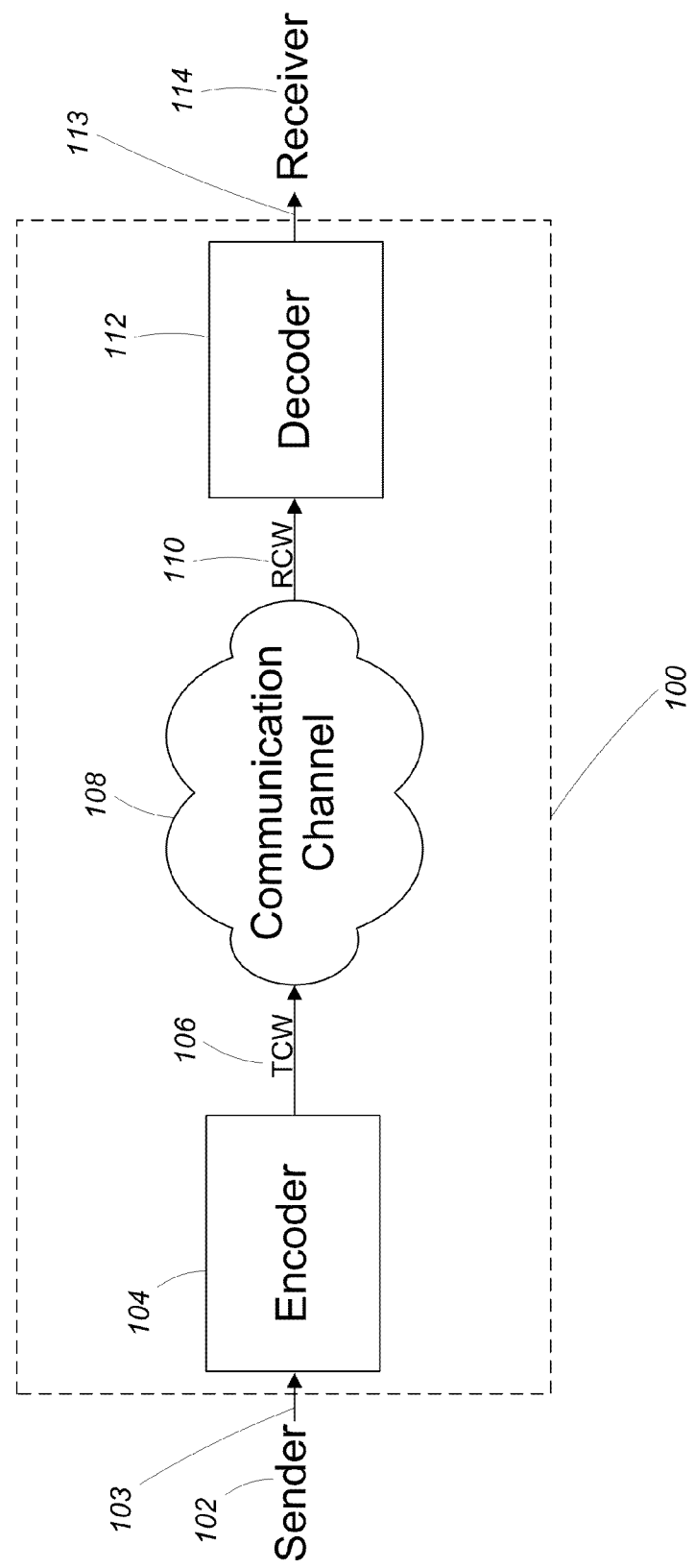
FIG. 1 is an overview of a data transmission system.

Referring to FIG. 1, a typical data transmission system 100 is configured to accept a series of input words 103, called "present words" from a sender 102. The present words 103 are provided to an encoder 104 where they are transformed into a sequence of transmit codewords (TCW) 106. In some examples, each transmit codeword 106 is encoded such that the present word 103 can be successfully recovered after transmission over a communication channel 108 (e.g., by the use of error correcting codes). The transmit codeword 106 is transmitted over the communication channel 108 wherein errors may be introduced into the transmit codeword's 106 data by corrupting factors such as noise in the communication channel 108. The result of transmitting the transmit codeword 106 over the communication channel 108 is a receive codeword (RCW) 110. The receive codeword 110 is accepted by a decoder 112 which recovers the present word 103 and provides it to a receiver 114.

2 Encoder Module

Figure 2:
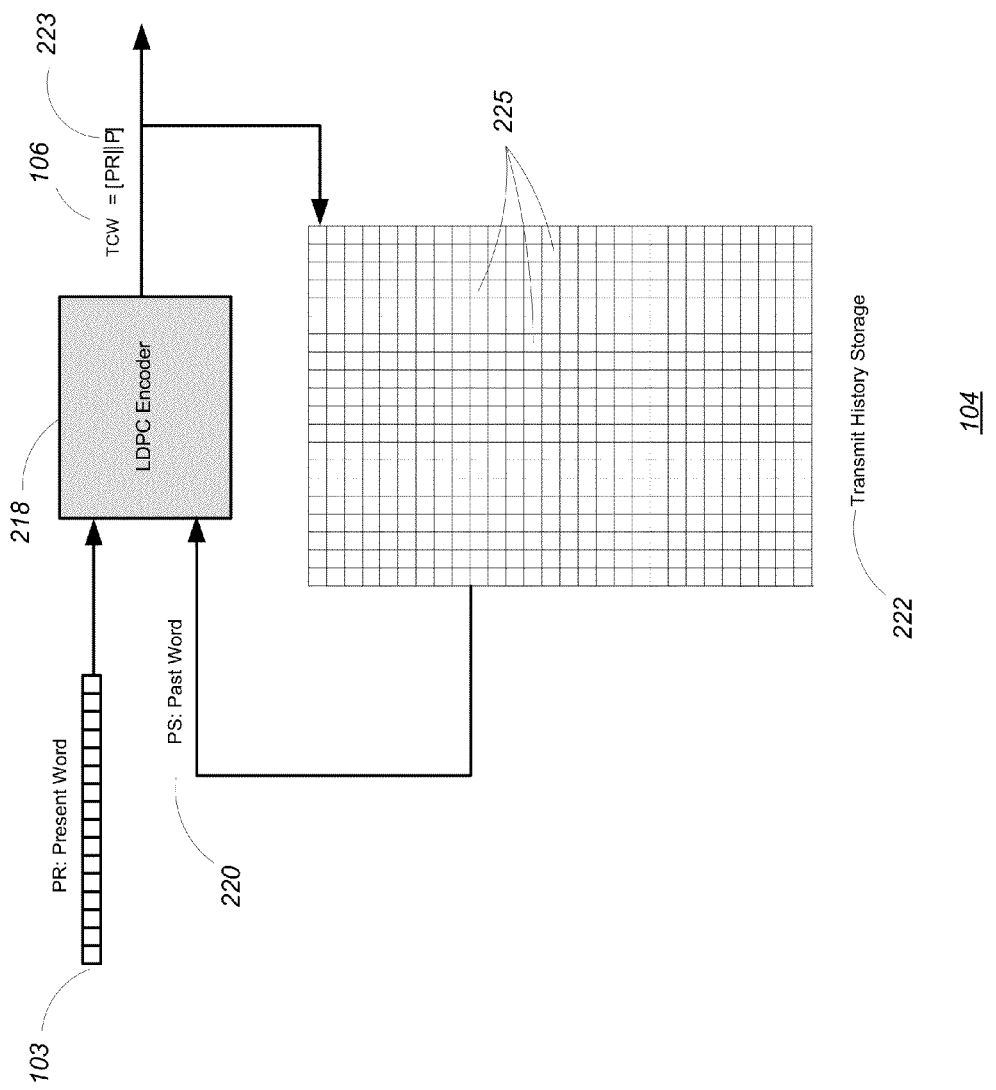
FIG. 2 is a block diagram of an encoder section of the data transmission system.

Referring to FIG. 2, the encoder module 104 utilizes present (PR) and past (PS) words (103, 220) and a low density parity check (LDPC) encoder 218 to create a transmit codeword 106 with the effect of providing an FEC block structure with attributes of an FEC block with infinite length.

In some examples, the present word 103 arrives at the input of the LDPC encoder 218 to be encoded along with the past word 220 which is selected from a Transmit History Storage 222 according to a formula described in greater detail below. The LDPC encoder 218 encodes the present word 103 and the past word 220 and produces an LDPC codeword (shown in FIG. 5, element 500) which includes the present word 103, the past word 220, and an error correction section (PC) 223. Based on the LDPC codeword 500, the transmit codeword 106 is formed, including only the present word 103 and the error correction section 223 from the LDPC codeword 500. The transmit codeword 106 is output to the communication channel 108 and is also stored in the Transmit History Storage 222.

2.1 Encoder Operation

Figure 4:
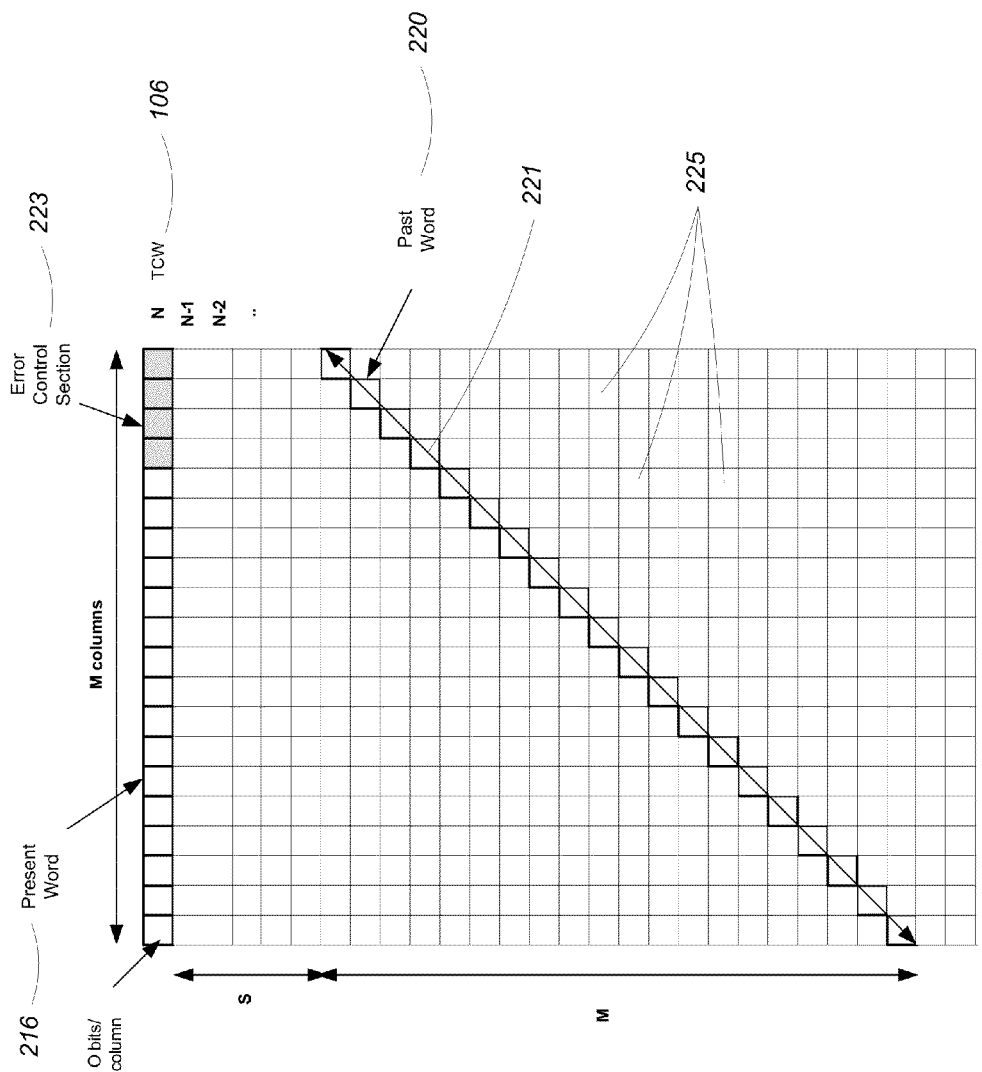
FIG. 4 is a Transmit History Storage.

Referring to FIG. 3, a pseudo-code implementation describes the operation of one example of the encoder module 104. The contents of the Transmit History Storage 222 include a number of past transmit codewords 106, referred to as TCW[i], where each index i refers to a row in the Transmit History Storage 222 (as shown in FIG. 4). Each stored transmit codeword 106 includes $N_{PS}$ bits. In some examples, the number of transmit codewords included in the Transmit History Storage 222 is limited to a predefined number, $N_{TB}$. In such examples the Transmit History Storage 222 forms a circular buffer such that at time n, entries for i=n−$N_{TB}$+1, . . . , n are present.

Referring to FIG. 4, each of the transmit codewords 106 stored in the Transmit History Storage 222 is organized into M transmit codeword history elements 225, where each transmit codeword history element 225 includes a number of bits, O. Thus, since there are $N_{PS}$ bits per transmit codeword 106, the number of transmit codeword history elements per transmit codeword is M=$N_{PS}$/O. The number of columns M and bits O is governed by the relationship M·O=$N_{PS}$=$N_{PR}$+$N_{PC}$.

Again referring to FIG. 3, the entry point of the encoder module is defined as Encoder Main (Line 9). The encoder module 104 initializes n to zero (Line 11) and then enters an infinite loop (Line 14). For each iteration of the loop, the value of n is incremented. The loop then waits for an input word to be accepted as a present word 103. When present word 103 is accepted, it is stored as PR (Line 15). With the new present word 103 in place, the Encode procedure for the $n^{th}$ accepted present word 103 is initiated (Line 16).

The Encode procedure for the $n^{th}$ accepted present word 103 is defined beginning at Line 21. The encoding operation forms the past word, PS 220, as a subset of the transmit codeword history elements 225 of the Transmit History Storage 222 (Line 25).

In some examples, the past information, PS 220, is formed by combining (e.g., concatenating) different transmit codeword history elements 225 from different stored transmit codewords 106 of the Transmit History Storage 222. For example, PS may be defined as a concatenation (indicated by the ∥ symbol) of elements:

$$PS \leftarrow TCW[n-S-M,M] \| TCW[n-S-M+1,M-1] \| \ldots \| TCW[n-S-1,1]$$

where S is an encoder distance (in rows) used to provide separation in time between the accepted present word, PR, 103 and the transmit codeword history elements 225 used to form the past word, PS 220. Referring to FIG. 4, the transmit codeword history elements 225 used to form the past word, PS 220, according to the above method are shown extending in the direction of diagonal 221.

Figure 5:
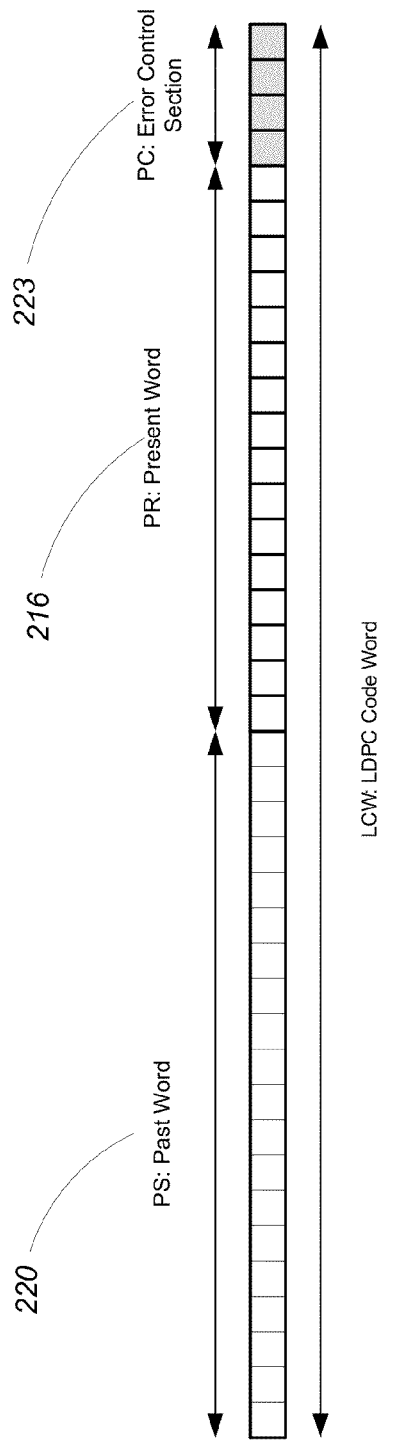
FIG. 5 shows the data organization of an LDPC codeword.

Again referring to FIG. 3, a combined codeword (CC) is formed by combining the past word, PS 220, with the present word, PR 103, (e.g., by concatenation) (Line 29). The combined codeword is then encoded using, for example, an LDPC encoder 218 (Line 32). The result of the LDPC encoding operation is an LDPC codeword (LCW). Referring to FIG. 5, one example of an LDPC codeword 500 includes a concatenation of the past word, PS 220, from the Transmit History Storage 222, the present word, PR 103, and the error correction section, PC 223, generated by the LDPC encoder 218. In some examples, the LDPC codeword 500 is internal to the LDPC encoder 218 and is not utilized by other modules of the encoder 104.

The error correction section 223 is influenced by both the past word, PS 220, from the Transmit History Storage 222 and the present word, PR 103. In some examples, the relationship between the number of bits in the present word, $N_{PR}$, and the number of bits in the error correction section 223, $N_{PC}$, is dictated by the desired code rate, R, where R=$N_{PR}$/($N_{PR}$+$N_{PC}$).

In some examples, the length of the LDPC codeword 500 is defined as $N_{PR}$+$N_{PS}$+$N_{PC}$ bits, where the total length is chosen to be convenient for hardware implementation. Furthermore, in some examples, the number of bits in the past word 220, $N_{PS}$, is chosen to equal the total of $N_{PR}$ and $N_{PC}$ as follows $N_{PS}$=$N_{PR}$+$N_{PC}$.

The Encode procedure then stores the present word, PR 103, and error correction information, PC 223, in the Transmit History Storage 222 as TCW[n] (Line 35). The Encode procedure then returns to the main routine where the current transmit codeword 106 at TCW[n] is transmitted to the communication channel 108 (Line 17).

Following the transmission of the transmit codeword 106, the loop in the main encoder routine proceeds to its next iteration and the procedure repeats.

3 Decoder

Figure 6:
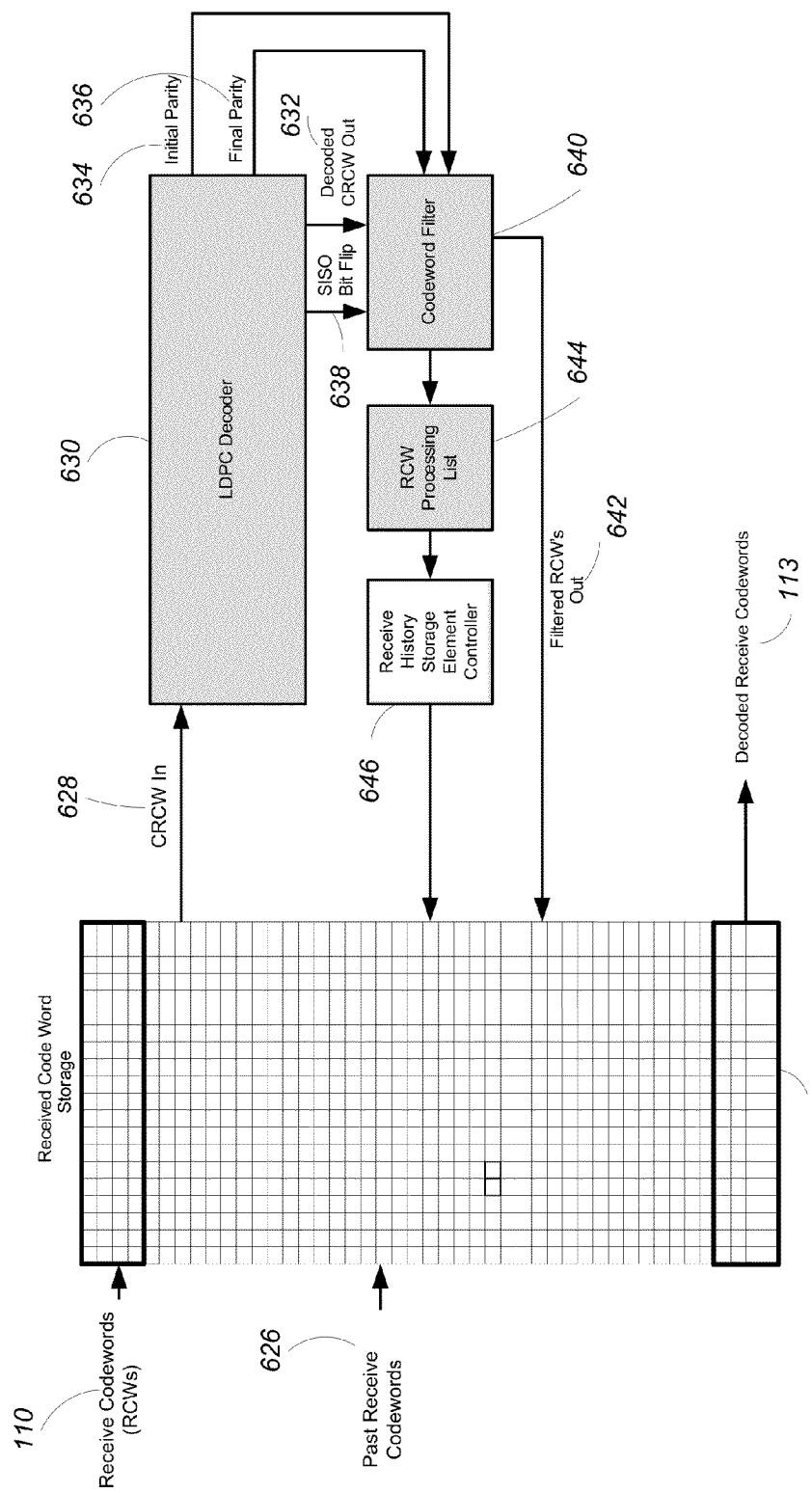
FIG. 6 is a block diagram of a decoder section of the data transmission system.

Referring to FIG. 6, the decoder module 112 receives incoming soft-input receive codewords (RCWs) 110 from a receiver (not shown). Each soft receive codeword 110 includes values that represent a certainty (e.g., probability, log likelihood) that each bit is a 1, for example, with a continuous probability value in a range from 0.0 to 1.0. The decoder module 112 utilizes the receive codewords 110 and previously decoded receive codewords 626 to produce a series of decoded output words 113. The decoder 112 is configured to iteratively and efficiently decode receive codewords 110 with a high coding gain.

In some examples, one or more soft-input receive codewords 110 are received by the decoder module 112 and stored in a Receive History Storage 624. The overall depth or decoder latency is determined by the size of the Receive History Storage 624. In some examples, the Receive History Storage 624 is organized as a circular buffer in the same manner that the Transmit History Storage 222 organized in the transmitter, however in general with a greater depth.

In one embodiment of the decoder, operation of the decoder involves repeatedly forming a combined receive codeword (CRCW) 628 from values in the storage 624, decoding the codeword in a soft decision LDPC decoder 630, and depending on the result of the decoding operation, output of the decoder are written back to the storage. In this embodiment, the previous codeword values are overwritten. In other embodiments, the storage includes the originally received values and also stores outputs of decoding. In general, each codeword 628 consists of a present word and a past word formed from storage elements in the same manner as at the transmitter, with the present word corresponding to a row of the storage and the past word corresponding to a diagonal section of the storage.

As is the case in the transmitter, each codeword element is part of two different combined codewords: as an element of a present codeword and as an element of a past codeword. Therefore, in general, each codeword element is used in at least two decoding operations. Furthermore, as described in detail below, decoding of a particular combined codeword (i.e., a combined codeword with its present part associated with a particular receive time) may be repeated in a controlled iteration to improve decoding accuracy, and therefore a particular codeword element (i.e., associated with a particular receive time and column) may in fact be used as input to more than two decoding operations.

After a receive codeword 110 is written to the Receive History Storage 624, present and past receive codewords 110, 626 from the Receive History Storage 624 are combined in a manner further described below to form a combined receive codeword (CRCW) 628 which is passed to a soft decision LDPC decoder 630 for decoding.

The soft decision LDPC decoder 630 outputs a decoded combined receive codeword 632, an initial parity measure 634, a final parity measure 636, and a soft-in-soft-out bit flip result 638. The decoded combined receive codeword 632 is a version of the combined receive codeword 628 that is error corrected (in a soft decoding sense) by the LDPC decoder 630. The initial and final parity output measures 634, 636 are measures of the number of even parity checks of the combined receive codeword 628 before and after the LDPC decoding process. The soft-in-soft-out bit flip result 638 indicates which, if any, sign bits of the decoded combined receive codeword 632 are flipped compared with the input combined receive codeword 628.

In some examples, the decoder 112 processes groups of combined receive codewords 628 in a decode cycle. A decode cycle will consist of the processing of E new receive codewords 110 and up to F past receive codewords 626. The value of E+F defines the processing limit of the decoder and is generally dictated by practical hardware implementation issues.

The outputs of the LDPC decoder 630 are provided to a codeword filter 640 that processes the decoded combined receive codewords 632 using the initial and final parity measures 634, 636 to determine whether the present and past codewords (110, 626) included in the decoded combined receive codeword 632 should replace the original present and past codewords (110, 626) in the Receive History Storage 624. If the codeword filter 640 determines that present and past codewords (110, 626) included in the decoded combined past codeword 632 should replace the original present and past codewords (110, 626) stored in the Receive History Storage 624, the decoded present receive codeword is provided to the Receive History Storage 624 through a filtered present receive codeword output 642.

Another output of the codeword filter 640 is provided to an RCW processing list 644 which maintains a list of past receive codewords 626 stored in the Receive History Storage 624 that are tagged for reprocessing based on feedback from the codeword filter 640. The RCW processing list 644 is provided to the Receive History Storage controller 646 which manages reads and writes made to the Receive History Storage 624. In a single decode cycle the Receive History Storage controller 646 chooses up to F previously decoded receive codewords 626 (in addition to the E new receive codewords 110) to be processed according to the RCW Processing List 644.

In some examples, the Receive History Storage 624 contains a finite number of receive codewords 110. Thus, when new receive codewords 110 are received, the oldest receive codewords in the Receive History Storage 624 are pushed out of the Receive History Storage 624 as decoded output words 113 in a first-in-first-out manner. Once receive codewords 626 approach the end of the memory, they are output and the soft values are turned into hard-decision outputs by slicing against zero. In some examples, the decoder outputs E decoded output words 113 per decoder cycle.

3.1 Decoder Operation

Referring to FIG. 7a, a pseudo-code implementation describes the operation of one example of the decoder module 112. First, a Receive History Storage 624, RCW[i] is defined (Line 1). Each receive codeword 110 entry in the Receive History Storage 624 includes $N_{PS}$ soft bit values. In some examples, the number of receive codewords 110 that can be stored in the Receive History Storage 624 is limited to a predefined number, $N_{RB}$. In such examples the Receive History Storage 624 forms a circular buffer such that at time n, entries for $i=n-N_{RB}+1, \ldots, n$ are present.

Figure 8:
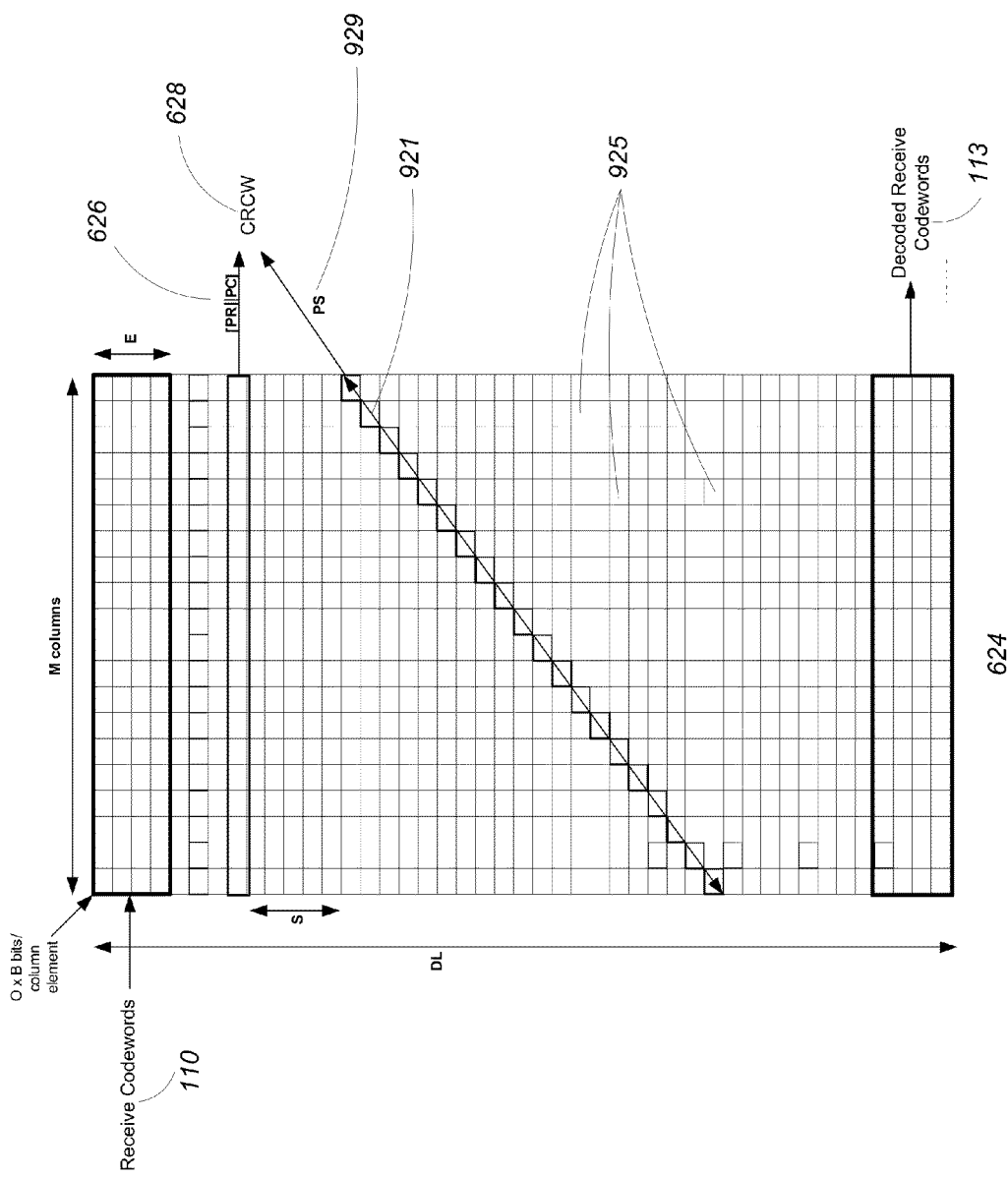
FIG. 8 is a Receive History Storage.

Referring to FIG. 8, as was the case with the encoder's Transmit History Storage 222, the Receive History Storage 624 is divided into M columns of receive codeword history elements 925. Each receive codeword history element 925 includes O soft values and each soft value includes B bits. In some examples, B has a value between 3 and 8. Thus, the total number of soft values in each receive codeword 110 is $N_{RBS}=M \cdot O$ and the number of bits in each receive codeword 110 is $N_{RBB}=M \cdot O \cdot B$.

Again referring to FIG. 7a, at line 2, the RCW Processing List 644, RPL, is defined (e.g., as a queue of indices into the Receive History Storage 624). The Decoder Main routine begins at line 4 of the pseudo-code. First, the Receive History Storage 624, the RCW Processing List 644, and an index variable k are initialized to zero (Lines 6 and 7). The Decoder Main routine then enters an infinite decoder loop (Line 8). At the beginning of each iteration of the infinite decoder loop, the loop waits for a block of E soft receive codewords 110 to be provided to the decoder 112 by a receiver (not shown). In other examples, decoder 112 receives receive codewords 110 one at a time. The newly received block of receive codewords 110 is stored in the Receive History Storage 624 (Line 10).

Following the reception of the receive codewords 110, the Decoder Main routine initiates a Decode_block procedure for the $k^{th}$ block of E receive codewords (Line 11). The definition of the Decode_block procedure begins at line 18 of the pseudo-code. The Decode_block procedure enters a loop that iterates through each RCW in the $k^{th}$ block of receive codewords and, for each receive codeword 110, calls the Decode_word(n) procedure (Lines 18-24).

The Decode_word procedure is defined beginning at line 26 of the pseudo-code. The procedure is configured to decode a receive codeword 110 using a combination of the present receive codeword 110 and a selection of elements of previously decoded receive codewords 626. If the Decode_word procedure determines that any of the elements of the selection of elements of the previously decoded receive codewords 626 is incorrect, the Decode_word procedure tags the past receive codeword 626 corresponding to the incorrect element for future re-decoding.

An error check case is executed at the beginning of the Decode_word procedure (Line 28). In particular, if the receive codeword 110 at the $n^{th}$ index is outside of the boundaries of the Receive History Storage 624, then the procedure returns without performing the decoding operation.

If the receive codeword 110 at the $n^{th}$ index lies within the boundaries of the Receive History Storage 624, the Decode_word procedure continues executing. First, the Decode_word procedure forms a past codeword, PS 929, as a subset of the receive codeword history elements 925 of the Receive History Storage 624. In some examples, the subset of the receive codeword history elements 925 of the Receive History Storage 624 is formed by combining (e.g., concatenating) different receive codeword history elements 925 from different stored receive codewords 626 of the Receive History Storage 624. For example, PS 929 may be defined as a concatenation (indicated by the || symbol) of elements:

$$PS \leftarrow RCW[n-S-M,M] \| RCW[n-S-M+1,M-1] \| \ldots \| RCW[n-S-1,1]$$

where S is an decoder distance used to provide separation in time between the most recently received codeword 110 and the receive codeword history elements 925 used to form PS 929. Referring to FIG. 8, the receive codeword history elements used to form PS 929 according to the above method are shown extending in the direction of the diagonal 921.

Again referring to FIG. 7a, a combined receive codeword (CRCW) 628 is then formed as a combination (e.g., a concatenation) of the past codeword, PS 929, and the present codeword, RCW 110 (Line 30). An initial measure of parity of the combined receive codeword 628, IP 634, is then determined (Line 31). The combined receive codeword 628 is provided to a soft decode operation (e.g., a soft LDPC decode), yielding a decoded combined receive codeword 632 (CRCW') (Line 32).

The decoded combined receive codeword 632 includes a decoded version of PS 929, PS' and a decoded version of the receive codeword 110, RCW'. A final measure of parity of the decoded combined receive codeword 632, FP 636, is then determined (Line 33).

Referring to FIG. 7b, the initial parity measure 634, final parity measure 636, and decoded soft combined receive codeword 632 are used by the codeword filter 640 to determine whether the soft decode operation converged (i.e., the final parity measure is improved compared to the initial parity measure). For example, if the ratio of the final parity measure to the initial parity measure is greater than a predetermined value (e.g., 1.3) OR if the final parity is greater than a predetermined value (e.g., 0.9) then it is determined that the soft decode operation has converged, known as a decode pass (Line 35). Conversely, failure of the soft decode operation to converge, is known as a decode fail. In some examples, the codeword filter 640 uses different information and different logical combinations of information to determine whether the soft decode operation has converged.

If the codeword filter 640 determines that the soft decode operation has converged, the decoded version of the receive codeword 110, RCW' is written into the Receive History Storage 624 at the location RCW[n], thus overwriting the receive codeword 110 with the decoded receive codeword RCW' (Line 37).

Furthermore, if the codeword filter 640 determines that the soft decode operation has converged, the decoded past codeword, PS', is written back into the Receive History Storage 624 (Line 38). As was previously discussed, PS 929 includes a number of receive codeword history elements 925 that are read from various locations in the Receive History Storage 624. Thus, writing PS' to the Receive History Storage 624 involves updating each of the locations in the Receive History Storage 624 with the corresponding decoded receive codeword history element of PS'.

Once the receive codeword history elements 925 are updated based on PS', a loop iterates through each receive codeword history element of PS 929 and PS' and determines whether the decoded receive codeword history element 925 in PS' differs (e.g., the sign of a soft bit value has changed) from the receive codeword history element 925 in PS (Lines 41-47). If a difference is found, the past receive codeword 626 associated with the updated receive codeword history element 925 is tagged for redecoding in the RCW processing list 644, RPL, (e.g., by adding the index of the past receive codeword 626) (line 45).

Upon completion of the Decode_word procedure, a Redecode procedure is called (FIG. 7a, Line 12). The Redecode procedure re-decodes up to F RCWs tagged for redecoding (e.g., by their index) in the RCW Processing List 644 (Lines 52-65). In some examples, the Redecode procedure iterates through the indices of the RCWs 110 stored in the Receive History Storage 624 starting from the most recently received RCW 110 and iterating backwards in time. The Redecode procedure compares each index to the indices of the RCWs tagged in the RCW Processing List 644 and when a match is found, the Decode_word procedure is called for the RCW 110 at the matched index (Line 60).

In some examples, the number of RCWs from the RCW Processing List 644 that can be decoded during a single decode cycle is dictated by practical hardware implementation issues. In other examples, a predetermined number of RCWs from the RCW processing list 644 are decoded per decoder cycle. In some examples, the Redecode procedure processes elements in the RCW processing list 644 in a first-in-first-out manner. In other examples, the Redecode procedure processes elements in the RCW processing list 644 based on the amount of time they have spent in the Receive History Storage 624.

Upon completion of the Redecode procedure, the decoded output words 113 are output to the receiver 114 (Line 13). The decoder loop then increments k by 1 (Line 14) and begins its next decode cycle.

3.2 Extrinsic Memory Mode

As introduced above, a combined receive codeword 928, which is provided as input to the soft LDPC decoder, includes a present word corresponding to a row of codeword elements and a past word corresponding to a diagonal series of codeword elements, and therefore each codeword element is part of two different combined codewords. In an embodiment described above, each memory element is effectively initialized with the value determined from the channel without error correction, and then selectively updated by overwriting the value using the result of certain decoding operations. When the codeword element is used again as part of a combined codeword (i.e., as a codeword element of either a past word or a present word), the then current value of that element is used for the input to the decoder.

In some examples, for instance when high code rates are involved, performance of the system can be significantly improved if the original channel values are retained in the codeword storage and used to form combined codewords for certain decoding operations in preference to decoder output values obtained in coding operations of combined codewords. Such decoder output values are stored or updated in the codeword storage but maintained in separate storage locations without overwriting the original channel value. This mode of operation is referred to as "Extrinsic Memory Operation."

In general, a characteristic of one or more embodiments of the Extrinsic Memory Operation mode is that when an element is used as part of a present codeword, the result of a previous decoding operation (if any) in which that element was used as part of a present codeword is ignored, and similarly, when an element is used as part of a past codeword, the result of a previous decoding operation (if any) in which that element was used as part of a past codeword is ignored. When an element is used as a part of a present (past) codeword and that same element was used as part of a past (present) codeword that was successfully decoded (i.e., decoded such that all parity constraints are satisfied), the value of the element resulting from that prior successful decoding is used as the input value for the new decoding in which the element is used as part of the present (past) codeword. Otherwise the original channel value is used in the new decoding. The successful decoding with the element was used as part of the past (present) codeword must have remained valid, such that if an intervening decoding operation changes the result of any element such that the parity constraints are no longer satisfied, the original channel value is also used.

To more specifically describe operation in an embodiment of the Extrinsic Memory Operation mode, if a receive codeword history element 925 was successfully decoded while it was used in the present portion 110 of the combined receive codeword 928, the decoded version of the receive codeword history element 925 is not used in subsequent decoding operations where the receive codeword history element 925 is included in the present portion 110 of the combined receive codeword 928. Instead, either the original, un-decoded version of the receive codeword history element 925 is included in the combined receive codeword 928 or, if the receive codeword history element 925 was previously decoded while it was included in the past codeword 929 portion of a combined receive codeword 928, the past decoded version is included in the present portion 110 of the combined receive codeword 928.

In some examples, the system enables extrinsic memory operation by maintaining three LLR values in each a receive codeword history element 925 along with an indicator of the validity of each of the LLR values. One LLR value represents the un-decoded version originally received as part of the receive codeword 110. This version is always considered to be valid for use in combined receive codewords 928.

A second LLR value is that which has been successfully decoded when the receive codeword history element 925 was included in the receive codeword portion 110 of the combined receive codeword 928. A third LLR value is that which was successfully decoded when the receive codeword history element 925 was included in the past codeword portion 929 of the combined receive codeword 928.

3.2.1 Extrinsic Memory Mode Operation

Referring to FIG. 9a, pseudo-code is shown which describes a decoding process of an extrinsic memory operation mode. Note that the encoding process (not shown in FIGS. 9a-9d) is substantially the same as is described above in FIG. 7.

A Decoder Main( ) procedure begins at line 1 of FIG. 9a. The procedure first initializes the receive codeword, RCW, a receive codeword processing list, RPL, and an index variable k. (Lines 3-4).

An infinite decoder loop begins at line 7. Within the infinite loop, a for loop iterates to populate an RCW in the Receive History Storage 624. (Lines 7-14). The RCW includes M receive codeword history elements 925, each including five sub-elements: $V_C$, $V_{PR}$, $V_{PS}$, $I_{PR}$, and $I_{PS}$.

$V_C$ is the original, un-decoded receive codeword history element 925 received from the channel 108. (Line 9)

$V_{PR}$ is a log likelihood ratio (LLR) value produced when the receive codeword history element 925 is decoded as part of the receive codeword portion 110 of the combined receive codeword 928 (referred to as a present decode operation). $V_{PR}$ is initialized to null. (Line 10)

$I_{PR}$ is an indicator of validity of $V_{PR}$. $I_{PR}$ is initialized to FALSE. (Line 12)

$V_{PS}$ is an LLR value produced when the receive codeword history element 925 is decoded as part of the past codeword portion 929 of the combined receive codeword 928 (referred to as a past decode operation). $V_{PS}$ is initialized to null. (Line 11)

$I_{PS}$ is an indicator of validity of $V_{PS}$. $I_{PS}$ is initialized to FALSE. (Line 13)

Following the formation of the RCW, a Decode_word(k) procedure is instantiated. (Line 16). The Decode_word procedure is defined beginning at line 23 of the pseudo-code. As was the case with the Decode_word procedure of FIG. 7, the Decode_word procedure is configured to decode a receive codeword 110 using a combination of the present receive codeword 110 and a selection of elements of previously decoded receive codewords 626. If the Decode_word procedure determines that any of the elements of the selection of elements of the previously decoded receive codewords 626 is incorrect, the Decode_word procedure tags the past receive codeword 626 corresponding to the incorrect element for future re-decoding. The Decode_word procedure of FIG. 9 is further configured to implement extrinsic memory operation, as is described below.

An error check case is executed at the beginning of the Decode_word procedure. (Line 25). If the receive codeword 110 at the $n^{th}$ index is outside of the boundaries of the Receive History Storage 624, then the procedure returns without performing the decoding operation.

If the error check case determines that the receive codeword 110 at the $n^{th}$ index lies within the boundaries of the Receive History Storage 624, the Decode_word procedure continues executing. First, a present codeword, PR is formed from the $n^{th}$ RCW in the Receive History Storage 624. In particular, a heuristic scheme forms PR by iterating through all of the receive codeword history elements 925 of the $n^{th}$ RCW. (Line 27). The $I_{PS}$ indicator of each receive codeword history element 925 is used to determine whether a past decode operation of the receive codeword history element 925 has previously succeeded. (Line 29). If $I_{PS}$ is FALSE, then no past decode operation has previously succeeded and the original channel value, $V_C$, for the receive codeword history element 925 is used in PR. (Line 30). Now referring to FIG. 9b, if $I_{PS}$ is TRUE, the past decoded channel LLR value, $V_{PS}$, is used in PR. (Line 32)

Then, a past codeword, PS, is formed as a subset of the receive codeword history elements 925 in the Receive History Storage 624. In particular, a heuristic scheme iterates through all of the receive codeword history elements 925 in the Receive History Storage 624 which will be used to form PS. The $I_{PR}$ indicator of each of the receive codeword history elements 925 is used to determine whether a present decode operation of the receive codeword history element 925 has previously succeeded. (Line 37). If $I_{PR}$ is FALSE, then no present decode operation has previously succeeded and the original channel value, $V_C$, for the receive codeword history element 925 is used in PS. (Line 38). If $I_{PR}$ is TRUE, the present decoded channel value, $V_{PR}$, is used in PS. (Line 40)

A combined receive codeword (CRCW) 628 is then formed as a combination (e.g., a concatenation) of the past codeword, PS 929, and the present codeword, RCW 110 (Line 43). An initial measure of parity of the combined receive codeword 628, IP 634, is then determined (Line 44). The combined receive codeword 628 is provided to a soft decode operation (e.g., a soft LDPC decode), yielding a decoded combined receive codeword 632 (CRCW') (Line 45).

The decoded combined receive codeword 632 includes a decoded version of PS 929, PS' and a decoded version of PR, PR'. A final measure of parity of the decoded combined receive codeword 632, FP 636, is then determined (Line 46).

The Decode_word procedure then uses a codeword filter 640 to determine if the decode operation was completely successful (i.e., all parity checks were satisfied) by comparing FP 636 to the number of parity checks, $N_{ps}$. (Line 53). If it is determined that all parity checks were satisfied, the receive codeword history elements 925 in the Receive History Storage 624 are updated.

Updating the receive codeword history elements 925 includes replacing (in the Receive History Storage 624) the contents of $V_{PR}$ of each of the M receive codeword history elements 925 included in PR with the LLR value of PR'. In some examples, instead of setting the LLR values to +/−∞, the LLR value is limited to be in a range +/−LLRCAP. Since PR was successfully decoded, the $I_{PR}$ indicator value is set to TRUE. If the sign of any of the LLR values in PR' is opposite its sign in PR, there is a disagreement between the LLR value decoded in the past and present decode operations. (Line 60). This is a symptom of a decode operation which satisfied parity checks but, in reality, was an erroneous decode operation. It is typically not known whether the past decode operation was erroneous or the present decode operation was erroneous. In this case, the current decode operation is completed normally. The output of this decode operation is used to update the receive codeword history elements 925 in the Receive History Storage 624. The disagreeing codeword is scheduled for redecoding by adding it to the RPL. (Line 62).

Referring to FIG. 9c, updating the receive codeword history elements 925 also includes replacing (in the Receive History Storage 624) the contents of $V_{PS}$ of each of the M receive codeword history elements 925 included in PS with the LLR value of PS'. In some examples, instead of setting the LLR values to +/−∞, the LLR value is limited to be in a range +/−LLRCAP. If the sign of any of the LLR values in PS' is opposite its sign in PS, there is a disagreement between the LLR value decoded in the past and present decode operations. (Line 71). This is a symptom of a decode operation which satisfied all parity checks but, in reality, was an erroneous decode operation. It is typically not known whether the past decode operation was erroneous or the present decode operation was erroneous. In this case, the current decode operation is completed normally. The output of this decode operation is used to update the receive codeword history elements 925 in the Receive History Storage 624. The disagreeing codeword is scheduled for redecoding by adding it to the RPL. (Line 73).

Upon completion of the Decode_word procedure, a Redecode procedure is called (as is shown in FIG. 7a, Line 12). The Redecode procedure re-decodes up to F RCWs tagged for redecoding (e.g., by their index) in the RCW Processing List 644. In some examples, the Redecode procedure iterates through the indices of the RCWs 110 stored in the Receive History Storage 624 starting from the most recently received RCW 110 and iterating backwards in time. The Redecode procedure compares each index to the indices of the RCWs tagged in the RCW Processing List 644 and when a match is found, the Decode_word procedure is called for the RCW 110 at the matched index.

Upon completion of the Redecode procedure, the decoded output words 113 are output to the receiver 114 (Line 18). The decoder loop then increments k by 1 (Line 19) and begins its next decode cycle.

In some examples, state information related to decode success and failure can be stored commonly for all O bits where the two codewords overlap. For example, one bit for each of the two decoding operations can be included in each receive history storage element 925 to represent decode failure ('0') or decode success ('1').

In some examples, the use of storage space can be minimized by overwriting some or all of the original version of the receive codeword history element 925 with LDPC decoder output values once the receive codeword history element 925 has been successfully decoded while included in both the present and past codeword portions 110, 929 of the combined receive codeword 928.

In some examples, fixed log likelihood ratio (LLR) values from the decoder output (i.e., a constant magnitude LLR setting) such that only the sign bit of the output from a successful decode needs to be saved from any LDPC decode operation.

4 Alternatives

It is noted that although a number of embodiments are described in the context of soft decision decoding, in some examples the Receive History Storage and/or the decoder can use binary data.

In some examples, LDPC codes can be constructed such that they are robust to 100% bit error bursts on the input data. For example, any constituent code where the check node order of the [PR||PC] section of the overall codeword is odd will be robust to 100% burst error events. If this condition is met then the initial parity of any receive codeword affected by the burst will tend towards zero indicating that a burst error has occurred. When this is detected all the PR and PC values can be inverted within the decoder and used for further processing. Considering the case where the initial parity of RCW is equal to X then after inversion the new parity reading will be NP-X.

In some examples, when the result of previously successful decoding operation is in conflict with the result of a currently successful decoding operation, the decoding result of one or more of the codeword history elements of the previously successful decoding operations is invalidated. Such a conflict can arise when the sign of the $V_{PS}$ value stored in a receive codeword history element differs from the sign of the $V_{PR}$ value stored in the same receive codeword history element.

5 Implementations

In some examples, the Transmit History Storage 222 and the Receive History Storage 624 are implemented in Random Access Memory (RAM).

The techniques and all of the functional operations described in this specification can be implemented in digital electronic circuitry, or in computer hardware, firmware, software, or in combinations of them. The system can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps of the system can be performed by one or more programmable processors executing a computer program to perform functions of the system by operating on input data and generating output. Method steps can also be performed by, and apparatus of the system can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

To provide for interaction with a user, the system can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. Interaction with a user does not need to be direct. The system can be implemented with an application programming interface allowing alternative means of exchanging input data and output data with the system.

It is to be understood that the foregoing description is intended to illustrate and not to limit the scope of the invention, which is defined by the scope of the appended claims. Other embodiments are within the scope of the following claims.

What is claimed is:

1. An encoding method comprising:
accepting data for transmission to a receiver, including accepting the data as a series of input words;
processing the series of input words to form a series of transmit codewords, each transmit codeword being dependent on a plurality of input words; and
providing the series of transmit codewords for transmission to the receiver;
wherein the processing of the series of input words includes, for each input word,
accessing selected elements from a data storage for previously encoded codewords to form past data;
forming a combined codeword from the input word and the past data,
performing an encoding operation on the combined codeword forming an encoded codeword, the encoded codeword including error control information;
forming a transmit codeword from the encoded codeword, the transmit codeword having less information than the encoded codeword and omitting at least some information represented in the past data; and
storing at least some of the transmit codeword as elements in the data storage for previously encoded codewords.

2. The method of claim 1 wherein performing the encoding operation on the combined codeword includes encoding an input word portion of the combined codeword such that a receiver of the transmit codeword can detect an inversion of the transmit codeword.

3. The method of claim 2 wherein the combined codeword is encoded using a code having odd check node order for the input word portion.

4. The method of claim 1 wherein accessing selected elements from the data storage for previously encoded codewords to form past data includes accessing elements from multiple previous transmit codewords in the data storage.

5. The method of claim 4 wherein each element accessed to form the past data comprises a multiple bit portion of a previous encoded codeword.

6. The method of claim 5 wherein each transmit codeword comprises a sequence of equal size multibit portions at corresponding offsets within the transmit codeword, and the elements accessed to form the past data comprise a portion of each of multiple previous transmit codewords each at a different offset with the transmit codeword.

7. The method of claim 1 wherein forming the combined codeword comprises concatenating the input word and the past data.

8. The method of claim 1 wherein performing the encoding operation comprises concatenating error control data representing the error control information determined from the input word and the past data to the combined codeword.

9. The method of claim 1 wherein performing the encoding operation includes determining parity data from the combined codeword to represent the error control information.

10. The method of claim 1 wherein performing the encoding operation includes performing a block encoding operation.

11. The method of claim 1 wherein forming the transmit codeword from the encoded codeword comprises omitting a part of the encoded codeword representing the past data.

12. The method of claim 11 wherein omitting the part of the encoded codewords includes omitting bits representing the past data.

13. The method of claim 11 wherein
forming the combined codeword comprises concatenating the input word and the past data,
performing the encoding operation comprises concatenating error control data representing the error control information to the combined codeword, and
forming the transmit codeword from the encoded codeword comprises forming the transmit codeword as a concatenation of the input word and the error control data omitting the past data.

14. The method of claim 1 wherein the input words comprise binary data.

15. The method of claim 1 wherein the transmit codewords comprise binary data.

16. The method of claim 1 wherein a size of the past data is equal to a size of the transmit codeword.

17. The method of claim 1 wherein the selected elements from the data storage include data elements from a plurality of previous transmit codewords.

18. Software stored on a non-transitory machine-readable medium comprising instructions for causing a data processing system to perform all the steps of an encoding method comprising:
accepting data for transmission to a receiver, including accepting the data as a series of input words;
processing the series of input words to form a series of transmit codewords, each transmit codeword being dependent on a plurality of input words; and
providing the series of transmit codewords for transmission to the receiver;
wherein the processing of the series of input words includes, for each input word,
accessing selected elements from a data storage for previously encoded codewords to form past data;
forming a combined codeword from the input word and the past data,
performing an encoding operation on the combined codeword forming an encoded codeword, the encoded codeword including error control information;
forming a transmit codeword from the encoded codeword, the transmit codeword having less information than the encoded codeword and omitting at least some information represented in the past data; and
storing at least some of the transmit codeword as elements in the data storage for previously encoded codewords.

19. Software stored on a non-transitory machine-readable medium comprising data for imparting functionality to a computer circuit design system to form a circuit description for a circuit for performing all the steps of an encoding method comprising:
accepting data for transmission to a receiver, including accepting the data as a series of input words;
processing the series of input words to form a series of transmit codewords, each transmit codeword being dependent on a plurality of input words; and
providing the series of transmit codewords for transmission to the receiver;
wherein the processing of the series of input words includes, for each input word,
accessing selected elements from a data storage for previously encoded codewords to form past data;
forming a combined codeword from the input word and the past data,
performing an encoding operation on the combined codeword forming an encoded codeword, the encoded codeword including error control information;
forming a transmit codeword from the encoded codeword, the transmit codeword having less information than the encoded codeword and omitting at least some information represented in the past data; and
storing at least some of the transmit codeword as elements in the data storage for previously encoded codewords.

20. The software of claim 19 comprising a hardware description language specification of the circuit.

21. An encoder for accepting a series of input words and providing a corresponding series of transmit codewords for transmission to a receiver, the encoder comprising:
a data storage for previously encoded codewords;
an encoding module configured process successive input words by
accessing selected elements from a data storage for previously encoded codewords to form past data,
forming a combined codeword from the input word and the past data,
performing an encoding operation on the combined codeword forming an encoded codeword, the encoded codeword including error control information,
forming a transmit codeword form the encoded codeword, the transmit codeword having less information than the encoded codeword and omitting at least some information represented in the past data, and
storing at least some of the transmit codeword as elements in the data storage for previously encoded codeword.

22. A decoding method comprising:
accepting receive data, including accepting a series of receive codewords each representing corresponding transmit codeword;
processing the series of receive codewords to form a series of output words, each output word being dependent on a plurality of receive codewords; and
providing output data, including providing the series of output words;
wherein the processing of the series of receive codewords includes, for each receive codeword applying a first decoding process to the receive codeword the first decoding process including
accessing selected elements from a data storage for decoded codewords to form past data,
forming a first combined codeword from the receive codeword and the past data,
performing a decoding operation on the first combined codeword forming a first corrected codeword, the decoding operation using error control information in the first combined codeword, and
for at least some receive codewords, storing at least some of the first corrected codeword as elements in the data storage for decoded codewords; and
wherein providing the output data includes retrieving data from the storage for corrected codewords.

23. The decoding method of claim 22 including, for each element of a plurality of elements included in each of the plurality of receive codewords, maintaining data characterizing results of previous decode operations which were performed on the element,
wherein forming the first combined codeword from the receive codeword and the past data includes, for each element of the plurality of elements in the receive codeword and for each element of the plurality of elements in the past data, determining a value to include in the combined codeword according to the data characterizing previous decode operations, and
determining if a corrected codeword produced by a previous decode operation is in conflict with the first corrected codeword and if so, invalidating at least some of the data characterizing results of previous decode operations included in the elements of the previously decoded codeword.

24. The method of claim 23 wherein the data characterizing previous decode operations includes
a first version of the element which was received with the receive data,
a second version of the element which was successfully decoded in the receive codeword portion of the combined codeword,
a third version of the element which was successfully decoded in the past data portion of the combined codeword,
a first validity indicator which indicates the validity of the second version of the element, and
a second validity indicator which indicates the validity of the third version of the element.

25. The method of claim 23 wherein determining the value to include in the combined codeword includes,
ensuring that a value of an element obtained by decoding the element in the receive codeword portion of the combined codeword is not included in subsequent receive codeword portions of the combined codeword, and
ensuring that a value of an element obtained by decoding the element in the past data portion of the combined codeword is not included in subsequent past data portions of the combined codeword.

26. The method of claim 24 wherein invalidating at least some of the data characterizing results of previous decode operations included in the elements of the previously decoded codeword includes setting at least one of the first and second validity indicators to FALSE for each of the elements of the previously decoded codeword.

27. The method of claim 22, further comprising:
accessing a plurality of processed receive codewords to which the first decoding operation has been at least once applied from the data storage for decoded codewords;
reprocessing the plurality of processed receive codewords, including for each processed received codeword applying a second decoding process to the processed receive codewords including
accessing selected elements from the data storage for decoded codewords to form past data,
forming a second combined codeword from the processed receive codeword and the past data,
performing the decoding operation on the second combined codeword forming a second corrected codeword, the decoding operation using error control information in the second combined codeword, and
for at least some of the processed received codewords, storing at least some of the second corrected codeword as elements in the data storage for decoded codewords.

28. The method of claim 22 wherein for at least some of the series of receive codewords, applying the first decoding process includes inverting a receive codeword portion of the first combined codeword according to a parity measure of the first combined codeword.

29. The method of claim 23 wherein the first decoding process and the second decoding process are the same.

30. The method of claim 23 wherein applying the first decoding process includes tagging corrected codewords in the data storage for decoded codewords for reprocessing.

31. The method of claim 30 including
for each of a plurality of decode cycles, during a first phase applying the first decoding process to a block of multiple receive codewords to which the first decoding operation has not yet been applied,
maintaining an indication of processed receive codewords that were updated during the first phase, and
during a second phase, applying the first decoding process to the indicated processed receive codewords.

32. The method of claim 22 wherein accessing selected elements from the data storage for corrected codewords to form past data includes accessing elements determined in multiple previous decoding operations from the storage.

33. The method of claim 32 wherein each element accessed to form the previous codewords comprises a multiple bit portion of a previous corrected codeword.

34. The method of claim 33 wherein each corrected codeword comprises a sequence of equal size multibit portions at corresponding offsets within the corrected codeword, and the elements accessed to form the past data comprise a portion of each of multiple previous corrected codewords each at a different offset with the corrected codeword.

35. The method of claim 22 wherein forming the combined codeword comprises concatenating the receive codeword and the past data.

36. The method of claim 22 wherein performing the decoding operation includes using parity data in the combined codeword.

37. The method of claim 22 wherein performing the decoding operation includes performing a block decoding operation.

38. The method of claim 22 wherein performing the decoding operation includes performing a Low Density Parity Check (LDPC) decoding operation.

39. The method of claim 22 wherein performing the decoding operation includes performing an iterative decoding operation.

40. The method of claim 22 wherein performing the decoding operation includes performing a soft decision decoding operation.

41. The method of claim 40 wherein accessing selected elements from the data storage for previous codewords includes accessing soft decision decoding output to form past data.

42. The method of claim 41 wherein the soft decision decoding output comprising data representing probability values.

43. The method of claim 22 wherein the receive codewords comprise data representing probability values.

44. The method of claim 22 wherein a size of the past data is equal to a size of the receive codeword.

45. The method of claim 22 wherein the selected elements from the data storage include data elements from a plurality of previous corrected codewords.

46. The method of claim 22 wherein the processing of each receive codeword further includes using a characteristic of the decoding operation to determine whether to store at least some of the corrected codeword as elements in the data storage for previous codewords.

47. The method of claim 46 wherein using the characteristic of the decoding operation includes using error-related characteristic of the corrected codeword.

48. The method of claim 46 wherein using the characteristic of the decoding operation includes using a characteristic based on a number of parity constraints satisfied by the corrected codeword.

49. The method of claim 48 wherein using the characteristic based on a number of parity constraints satisfied by the corrected codeword include using a characteristic further based on a number of parity constraints satisfied by the combined codeword.

50. Software stored on a non-transitory machine-readable medium comprising instructions for causing a data processing system to perform all the steps of a decoding method comprising:
    accepting receive data, including accepting a series of receive codewords each representing corresponding transmit codeword;
    processing the series of receive codewords to form a series of output words, each output word being dependent on a plurality of receive codewords; and
    providing output data, including providing the series of output words;
    wherein the processing of the series of receive codewords includes, for each receive codeword applying a first decoding process to the receive codeword the first decoding process including
        accessing selected elements from a data storage for decoded codewords to form past data,
        forming a first combined codeword from the receive codeword and the past data,
        performing a decoding operation on the first combined codeword forming a first corrected codeword, the decoding operation using error control information in the first combined codeword, and
        for at least some receive codewords, storing at least some of the first corrected codeword as elements in the data storage for decoded codewords; and
    wherein providing the output data includes retrieving data from the storage for corrected codewords.

51. Software stored on a non-transitory machine-readable medium comprising data for imparting functionality to a computer circuit design system to form a circuit description for a circuit for performing all the steps of a decoding method comprising:
    accepting receive data, including accepting a series of receive codewords each representing corresponding transmit codeword;
    processing the series of receive codewords to form a series of output words, each output word being dependent on a plurality of receive codewords; and
    providing output data, including providing the series of output words;
    wherein the processing of the series of receive codewords includes, for each receive codeword applying a first decoding process to the receive codeword the first decoding process including
        accessing selected elements from a data storage for decoded codewords to form past data,
        forming a first combined codeword from the receive codeword and the past data,
        performing a decoding operation on the first combined codeword forming a first corrected codeword, the decoding operation using error control information in the first combined codeword, and
        for at least some receive codewords, storing at least some of the first corrected codeword as elements in the data storage for decoded codewords; and
    wherein providing the output data includes retrieving data from the storage for corrected codewords.

52. The software of claim 51 comprising a hardware description language specification of the circuit.

53. A decoder for accepting a series of receive codewords from a transmitter and providing a corresponding series of output words, the decoder comprising:
    a data storage for decoded codewords;
    a decoding module configured process successive receive codewords by applying a first decoding process to each receive codeword, the first decoding process including
        accessing selected elements from the data storage for decoded codewords to form past data;
        forming a first combined codeword from the receive codeword and the past data,
        performing a decoding operation on the first combined codeword forming a first corrected codeword, the decoding operation using error control information in the first combined codeword, and
        for at least some receive codewords, storing at least some of the corrected codeword as elements in the data storage for decoded codewords; and
    an output module configured to provide the output words by retrieving data from the storage for corrected codewords.

54. The decoder of claim 53
    wherein the decoding module is further configured to
    access a plurality of processed receive codewords to which the first decoding operation has been at least once applied from the data storage for decoded codewords;
    reprocess the plurality of processed receive codewords, including for each processed receive codeword applying a second decoding process to the processed receive codewords including
        accessing selected elements from the data storage for decoded codewords to form past data,
        forming a second combined codeword from the processed receive codeword and the past data,
        performing the decoding operation on the second combined codeword forming a second corrected codeword, the decoding operation using error control information in the second combined codeword, and
        for at least some of the processed received codewords, storing at least some of the second corrected codeword as elements in the data storage for decoded codewords.

55. A data communication method comprising:
    accepting data for transmission to a receiver, including accepting the data as a series of input words;
    processing the series of input words to form a series of transmit codewords, each transmit codeword being dependent on a plurality of input words; and
    providing the series of transmit codewords for transmission to the receiver;
    wherein the processing of the series of input words includes, for each input word,
        accessing selected elements from a data storage for previously encoded codewords to form past data;
        forming a combined codeword from the input word and the past data, performing an encoding operation on the combined codeword forming an encoded codeword, the encoded codeword including error control information;

forming a transmit codeword from the encoded codeword, the transmit codeword having less information than the encoded codeword and omitting at least some information represented in the past data; and storing at least some of the transmit codeword as elements in the data storage for previously encoded codewords;

transmitting the transmit codewords over a communication channel to the receiver; and accepting receive data, including accepting a series of receive codewords each representing corresponding transmit codeword;

processing the series of receive codewords to form a series of output words, each output word being dependent on a plurality of receive codewords; and providing output data, including providing the series of output words;

wherein the processing of the series of receive codewords includes, for each receive codeword applying a first decoding process to the receive codeword the first decoding process including accessing selected elements from a data storage for decoded codewords to form past data, forming a first combined codeword from the receive codeword and the past data, performing a decoding operation on the first combined codeword forming a first corrected codeword, the decoding operation using error control information in the first combined codeword, and for at least some receive codewords, storing at least some of the first corrected codeword as elements in the data storage for decoded codewords; and wherein providing the output data includes retrieving data from the storage for corrected codewords.

56. A data communication system comprising:

an encoder for accepting a series of input words and providing a corresponding series of transmit codewords for transmission to a receiver, the encoder including, a data storage for previously encoded codewords;

an encoding module configured process successive input words by accessing selected elements from a data storage for previously encoded codewords to form past data, forming a combined codeword from the input word and the past data, performing an encoding operation on the combined codeword forming an encoded codeword, the encoded codeword including error control information, forming a transmit codeword form the encoded codeword, the transmit codeword having less information than the encoded codeword and omitting at least some information represented in the past data, and storing at least some of the transmit codeword as elements in the data storage for previously encoded; and a decoder coupled to the encoder over a communication channel for accepting a series of receive codewords from a transmitter and providing a corresponding series of output words, the decoder including, a data storage for decoded codewords;

a decoding module configured process successive receive codewords by applying a first decoding process to each receive codeword, the first decoding process including accessing selected elements from the data storage for decoded codewords to form past data;

forming a first combined codeword from the receive codeword and the past data, performing a decoding operation on the first combined codeword forming a first corrected codeword, the decoding operation using error control information in the first combined codeword, and for at least some receive codewords, storing at least some of the corrected codeword as elements in the data storage for decoded codewords; and an output module configured to provide the output words by retrieving data from the storage for corrected codewords.

* * * * *